(12) United States Patent
Shinoda

(10) Patent No.: US 6,674,514 B2
(45) Date of Patent: Jan. 6, 2004

(54) ILLUMINATION OPTICAL SYSTEM IN EXPOSURE APPARATUS

(75) Inventor: Ken-ichiro Shinoda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/809,056

(22) Filed: Mar. 16, 2001

(65) Prior Publication Data

US 2002/0001134 A1 Jan. 3, 2002

(30) Foreign Application Priority Data

Mar. 16, 2000 (JP) .......................... 2000-074558

(51) Int. Cl.⁷ .................... G03B 27/72; G03B 27/42; G03B 27/28; G02B 5/30

(52) U.S. Cl. ..................... 355/71; 355/53; 359/487; 359/494

(58) Field of Search ................ 355/53, 67, 68, 355/69, 70, 71; 359/483, 485, 487, 494, 831, 833, 834; 353/20

(56) References Cited

U.S. PATENT DOCUMENTS

| | | | | |
|---|---|---|---|---|
| 3,714,413 A | * | 1/1973 | Craig | 355/71 |
| 4,759,616 A | | 7/1988 | Marchant | 350/421 |
| 5,253,110 A | | 10/1993 | Ichihara et al. | 359/619 |
| 5,534,970 A | * | 7/1996 | Nakashima et al. | 353/122 |
| 5,657,164 A | * | 8/1997 | Shuman | 359/494 |
| 5,751,482 A | * | 5/1998 | Challener, IV | 359/485 |
| 6,229,645 B1 | * | 5/2001 | Hendrix | 359/483 |
| 6,229,647 B1 | * | 5/2001 | Takahashi et al. | 355/45 |
| 6,341,867 B1 | * | 1/2002 | Itoh | 353/20 |
| 6,396,568 B1 | * | 5/2002 | Nishi | 355/53 |

FOREIGN PATENT DOCUMENTS

| | | |
|---|---|---|
| JP | 09-159964 | 6/1997 |
| JP | 11-064778 | 3/1999 |

* cited by examiner

*Primary Examiner*—Alan A. Mathews
(74) *Attorney, Agent, or Firm*—Fitzpatrick, Cella, Harper & Scinto (57) ABSTRACT

An optical system includes an internal reflection type optical member for changing a direction of advancement of an approximately linearly polarized light on the basis of total reflection and a depolarizing member for dissolving linear polarization of light emitted from the optical member.

19 Claims, 7 Drawing Sheets

ILLUMINATION OPTICAL SYSTEM IN EXPOSURE APPARATUS

FIELD OF THE INVENTION AND RELATED ART

This invention relates to an optical system and, more particularly, an illumination optical system for directing light from a light source to a surface to be illuminated. The present invention is suitably applicable, for example, to an illumination optical system in an exposure apparatus used in a photolithographic process for the manufacture of fine patterns such as semiconductor devices, for example.

In exposure apparatuses used in a photolithographic process for the manufacture of fine patterns such as semiconductor devices like semiconductor chips (e.g., ICs), liquid crystal panels, CCDs, thin magnetic heads, and micromachines, for example, a resolving power much higher than that attained conventionally is required to meet further miniaturization of the pattern. If k1 is a constant which meets the process, the wavelength of exposure light is $\lambda$, the numerical aperture of a projection optical system of an exposure apparatus is NA, and the resolving power is R, we obtain:

$$R = k1 \cdot \lambda/NA.$$

It is seen from this equation that, to obtain a higher resolving power, the NA of the projection optical system should be enlarged and the wavelength of the light source should be shortened. In practice, the wavelength of exposure light used in exposure apparatuses has been changed from i-line (365 nm) to a KrF excimer laser (248 nm) or an ArF excimer laser (193 nm). A further shortening of the wavelength is expected, such as the use of an $F_2$ laser (157 nm), for example.

On the other hand, inside the exposure apparatus, in an illumination optical system for directing light from a light source to a reticle surface (surface to be illuminated) having a pattern formed thereon, due to the structure of the apparatus, it is necessary that light is deflected plural times. Conventionally, deflecting means therefor uses a mirror which comprises a substrate having a dielectric multilayered film formed thereon to attain a high reflection factor. Such a dielectric multilayered film mirror comprises an alternate accumulation of a film (H) having a higher refractive index (nH) and an optical film thickness corresponding to one-fourth (¼) of the center wavelength of the exposure light, and a film (L) having a lower refractive index (nL) and an optical film thickness corresponding to one-fourth (¼) of the center wavelength of exposure light. With the alternate accumulation of these layers, the reflection factor to incident light is increased.

As regards such a dielectric multilayered film mirror, it should have a sufficiently high reflection factor to the light of wavelength used as well as a sufficiently high durability thereto. However, as the wavelength used becomes shorter, from i-line (365 nm) to a KrF excimer laser (248 nm) or an ArF excimer laser (193 nm), it becomes difficult to attain a sufficiently high reflection factor with such a dielectric multilayered film mirror.

This causes a decrease of illuminance of exposure light in an exposure apparatus which uses a light source of a short wavelength, and an increase in exposure time. It results in a lower throughput of the exposure apparatus or a failure in attaining a sufficient light quantity necessary for performing alignment measurement, for example.

On the other hand, the light to be supplied by a KrF excimer laser or an ArF excimer laser is an approximately linearly polarized light. The linearly polarized light has a high coherency, and the imaging performance differs with the direction of polarization. For these reasons, when linearly polarized light is used directly as exposure light, there is a possibility that non-uniform exposure results from an interference fringe or that the resolution differs with the direction of polarization.

SUMMARY OF THE INVENTION

It is accordingly an object of the present invention to provide an optical system by which light can be deflected while a high reflection factor is retained even with respect to light of a short wavelength, and by which depolarization of linearly polarized light can be accomplished.

In accordance with an aspect of the present invention, there is provided an optical system, comprising: an internal reflection type optical member effective to change a direction of advancement of an approximately linearly polarized light on the basis of total reflection; and a depolarizing member for dissolving linear polarization of light emitted from said optical member.

In one preferred form of this aspect of the present invention, said optical member may have a light entrance surface arranged so that a P-polarized component is incident thereon with a Brewster angle.

The optical member may have a light exit surface arranged so that a P-polarized component is emitted therefrom with a Brewster angle.

At the whole reflection surface of said optical member, the approximately linearly polarized light may be incident with an angle not smaller than a critical angle.

When an angle defined between a light entrance surface and a light exit surface of said optical member is $\theta$ and an incidence angle of light incident on the while reflection surface of said optical member is A2, said optical member may satisfy a relation $\theta + 2 \cdot A2 = 180$ (deg).

The angle $\theta$ defined between the light entrance surface and the light exit surface of said optical member may be 90 deg.

The approximately linearly polarized light to be deflected by said optical member may have an opening angle at one side, not greater than 3 deg.

The optical member may have a light entrance surface and a light exit surface each having an anti-reflection film formed thereon.

The optical member may have a light entrance surface and a light exit surface each being over-coated with a material having a refractive index lower than that of said optical member.

The optical system may further comprise a mirror having a dielectric film, wherein, for deflection of the approximately linearly polarized light, when the light is P-polarized light with respect to a light entrance surface of said mirror having the dielectric film or said optical member, said optical member may be used for the deflection, and wherein, when the light is S-polarized light, said mirror may be used for the deflection.

In accordance with another aspect of the present inventions there is provided an illumination optical system, comprising: an internal reflection type optical member effective to change a direction of advancement of an approximately linearly polarized light on the basis of total reflection; and a depolarizing member for dissolving linear polarization of light emitted from said optical member.

In one preferred form of this aspect of the present invention, the illumination optical system may further comprise a fly's eye lens for receiving light having its linear polarization dissolved by said depolarizing member and for producing a plurality of secondary light sources at a light exit surface thereof, and a lens system for superposing light beams from the secondary light sources one upon another on the surface to be illuminated.

The optical member may have a light entrance surface arranged so that a P-polarized component is incident thereon with a Brewster angle.

The optical member may have a light exit surface arranged so that a P-polarized component is emitted therefrom with a Brewster angle.

At the whole reflection surface of said optical member, the approximately linearly polarized light may be incident with an angle not smaller than a critical angle.

When an angle defined between a light entrance surface and a light exit surface of said optical member is θ and an incidence angle of light incident on the while reflection surface of said optical member is A2, said optical member may satisfy a relation θ+2·A2=180 (deg).

The angle θ defined between the light entrance surface and the light exit surface of said optical member may be 90 deg.

The approximately linearly polarized light to be deflected by said optical member may have an opening angle at one side, not greater than 3 deg.

The optical member may have a light entrance surface and a light exit surface each having an anti-reflection film formed thereon.

The optical member may have a light entrance surface and a light exit surface each being over-coated with a material having a refractive index lower than that of said optical member.

The optical system may further comprise a mirror having a dielectric film, wherein, for deflection of the approximately linearly polarized light, when the light is P-polarized light with respect to a light entrance surface of said mirror having the dielectric film or said optical member, said optical member may be used for the deflection, and wherein, when the light is S-polarized light, said mirror may be used for the deflection.

In accordance with a further aspect of the present invention, there is provided an exposure apparatus, comprising: an illumination optical system including (i) an internal reflection type optical member effective to change a direction of advancement of an approximately linearly polarized light on the basis of total reflection, and (ii) a depolarizing member for dissolving linear polarization of light emitted from said optical member; and a projection optical system for projecting a pattern, formed on a surface to be illuminated by said illumination optical system, onto a substrate.

In accordance with a yet further aspect of the present invention, there is provided a device manufacturing method, comprising the steps of: illuminating a surface to be illuminated, by use of an illumination optical system which includes (i) an internal reflection type optical member effective to change a direction of advancement of an approximately linearly polarized light on the basis of total reflection, and (ii) a depolarizing member for dissolving linear polarization of light emitted from the optical member; and transferring a pattern, formed on the surface to be illuminated, onto a substrate by use of a projection optical system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
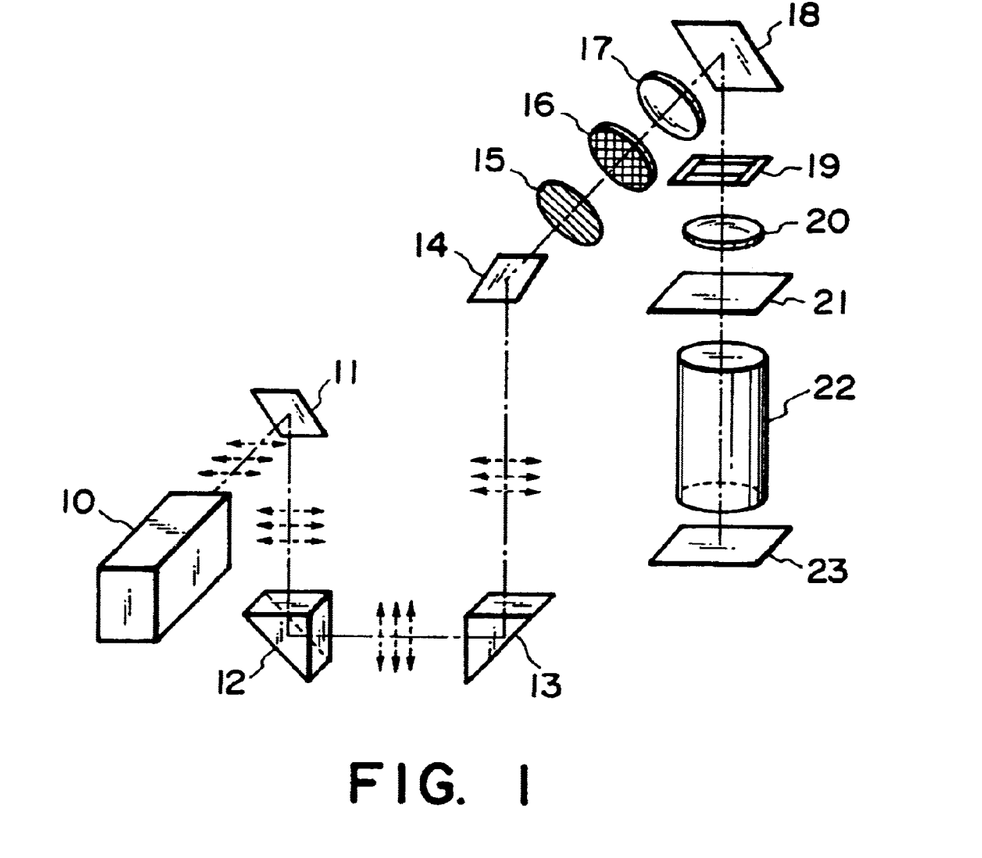
FIG. 1 is a schematic view of an exposure apparatus into which an optical system according to the present invention is incorporated.

FIG. 1 shows a first embodiment wherein the invention is applied to an illumination optical system in an exposure apparatus for the manufacture of semiconductor devices. Denoted in FIG. 1 at 10 is an ArF excimer laser oscillator which is a light source for producing, as exposure light (illumination light), a substantially parallel and approximately linearly polarized light. Denoted at 11–14 are deflection optical elements for deflecting light from the laser. Denoted at 15 is a depolarization optical element for dissolving (depolarizing) the polarization of the approximately linearly polarized light. Denoted at 16 is a fly's eye lens which comprises a plurality of small lenses arrayed two-dimensionally. Of these deflection optical elements, those denoted at 11 and 14 are mirrors each having a dielectric film formed thereon. Those denoted at 12 and 13 are internal reflection type optical elements.

Denoted at 17 is a condenser lens. A plurality of secondary light source images defined at the light exit surface of the fly's eye lens are reflected by a mirror 18, and these images are superposed one upon another on the plane of a masking blade 19 (surface to be illuminated), whereby the surface is Koehler-illuminated uniformly. Thus, in this embodiment, the illumination optical system comprises deflection optical elements 11–14, depolarization optical element 15, fly's eye lens 16, condenser lens 17, mirror 18, imaging lens 20, and so on. The imaging lens 20 serves to transfer an aperture shape of the masking blade 19 onto the surface of a reticle 21, such that a required region on the reticle 21 surface can be illuminated uniformly. Denoted at 22 is a projection optical system for projecting a circuit pattern formed on the reticle 21 surface, in a reduced scale. Denoted at 23 is a wafer (substrate) onto which the circuit pattern of the reticle 21 is to be projected. The wafer is placed on an exposure plane.

In this embodiment, the surfaces of the masking blade 19, reticle 21 and wafer 23 are placed in an optically conjugate relation with each other, and each of these surfaces is a surface to be illuminated. Also, the light exit surface of the fly's eye lens, where secondary light sources are to be produced, and a pupil plane of the projection optical system 22 are held in an optically conjugate relation with each other.

The depolarization optical element 15 for dissolving linear polarization is an optical element for transforming approximately linearly polarized light, supplied from the ArF excimer laser oscillator 10, into non-polarized light. It comprises a wedge-shaped optical member whose optical length differs with the position where the light passes. The depolarization optical element 15 should be disposed upstream (light source side) of the fly's eye lens 16 with respect to the advancement direction of light, in order to avoid an interference fringe to be produced on the surface to be illuminated (masking blade 19, reticle 21 or wafer 23) by the interference of a light beam from the secondary light sources, formed at the light exit surface of the fly's eye lens, and also to prevent changes in imaging performance with the polarization direction. As for the linear polarization dissolving member, not only a depolarization optical element such as used in this embodiment but also a quarter waveplate, for example, may be used. When a quarter waveplate is used, linearly polarized light is converted into circularly polarized light.

Generally, due to the structure or from the necessity in operation, light from the ArF excimer laser oscillator 10 has to be deflected plural times in certain directions, before it reaches the fly's eye lens 16. Here, in order that the illuminance on the wafer 23 is kept high to avoid a decrease of throughput, the loss of light quantity by the deflection must be held minimum. The present invention is based on the finding that a dielectric film mirror based on total reflection has a higher reflection factor for S-polarized light as compared with that for P-polarized light while an internal reflection type optical element shows a higher deflection efficiency to P-polarized light. In consideration of it, the internal reflection type optical element (deflection optical elements 12 and 13) is used for deflection of P-polarized light. On the other hand, for deflection of S-polarized light, the dielectric film mirror (deflection optical elements 11 and 14) is used. The depolarizing optical element 15 is used to transform the polarization state to random or circular polarization. By this, light of appropriate polarization state for illumination can be supplied to the fly's eye lens 16.

As a result of this, the illuminance on the wafer 23 can be kept high and the throughput can be held high. Further, non-uniform exposure due to the interference fringe or degradation of resolution depending on the polarization direction can be avoided, such that high precision exposure is assured.

Figure 2A:
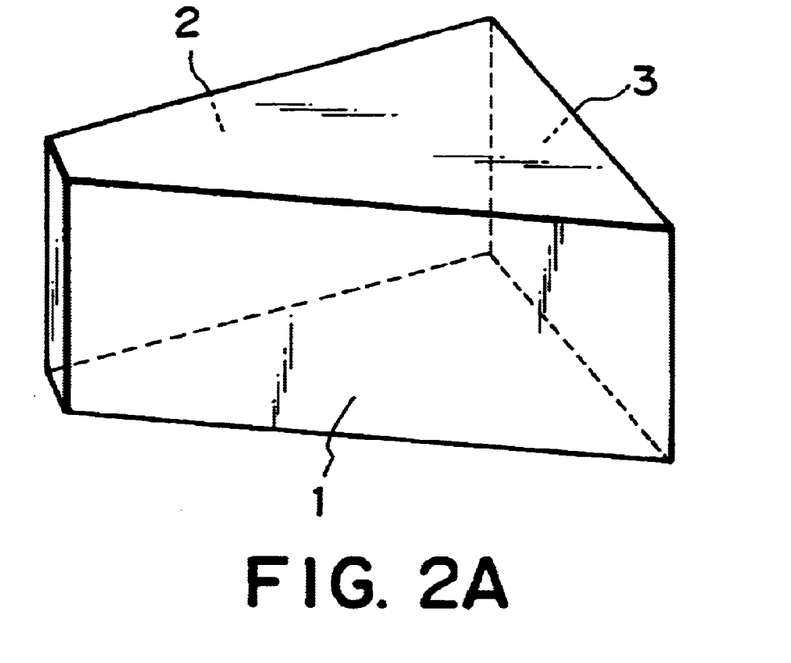
FIG. 2A is a perspective view of an internal reflection type optical element according to the present invention.

FIG. 2A is a schematic view of an internal reflection type optical system according to a first embodiment of the present invention. This optical element is made of a glass material having a sufficient transmission factor (99.5%/cm or more) with respect to light of a wavelength not longer than 200 nm. Denoted in the drawing at 1 is a light entrance surface, and denoted at 2 is a reflection surface (total reflection surface) Denoted at 3 is a light exit surface. For efficient deflection of light, not only a glass material having a sufficiently high transmission factor should be used but also the loss of light quantity at the light entrance surface, the reflection surface and the light exit surface has to be made minimum.

Figure 2B:
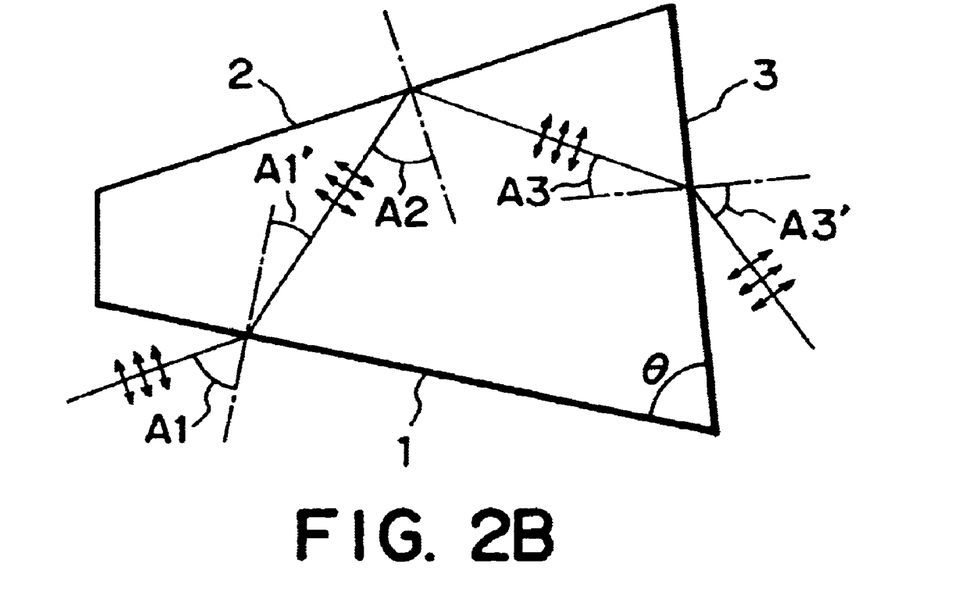
FIG. 2B is a schematic view for explaining an internal reflection type optical element in a first embodiment of the present invention.

FIG. 2B is a plan view of the internal reflection type optical element of FIG. 2A, and it illustrates the conditions for attaining efficient light deflection. Reference characters A1, A2 and A3 are incidence angles on the light entrance surface 1, the reflection surface 2 and the light exit surface 3, respectively. Reference characters A1' and A3' are refraction angles at the light entrance surface 1 and the light exit surface 3, respectively.

It is now assumed that the internal reflection type optical element consists of a fluorite glass ($CaF_2$) having a refractive index nc=1.5 with respect to a wavelength of 193 nm, and that the space surrounding it is filled with a medium (refractive index ng=1) having a sufficient transmissivity to the wavelength of 193 nm. Also, the light incident thereon is parallel light having a wavelength of 193 nm, and it is linearly polarized light.

Here, in order that the light is incident on the light entrance surface 1 without a loss of light quantity, a relation "the direction of polarization of the incident light is registered with a direction on the incidence plane (P-polarization) while a Brewster angle is satisfied" should be accomplished. The Brewster angle (deflection angle) refers to an angle which satisfies a relation:

$$\tan \psi_{b1} = nc/ng$$

where $\psi_{b1}$ is an incidence angle of light, entering from a substance of a refractive index ng to a substance of a refractive index nc. Since in this embodiment $\tan \psi_{b1}$=nc/ng=1.5, the angle $\psi_{b1}$ is about 56.3 deg. Thus, by setting the incidence angle A1=$\psi_{b1}$, the incident light of P-polarization can pass through the light entrance surface 1 with an approximately 100% efficiency and it can be directed to the reflection surface 2.

Next, in order that the light impinging on the reflection surface 2 is reflected without a loss of light quantity, the reflection surface should be disposed to satisfy the total reflection condition. Namely, the incidence angle A2 of the light impinging on the reflection surface 2 should satisfy the condition of "not smaller than the critical angle and not larger than 90 deg."

Here, the critical angle refers to a smallest incidence angle $\psi_c$ that causes total reflection and, when light is incident from a substance of a refractive index nc to a substance of a refractive index ng, it is an angle which satisfies a relation:

$$\sin \psi_c = ng/nc$$

Since in this embodiment $\sin \psi_c$=ng/nc=0.666 . . . , the angle is about 41.8 deg.

If the total reflection is made under a condition other than the critical angle, there occurs a phase change of different amounts between P-polarization and S-polarization. In this embodiment, however, the light is linearly polarized light of only a P-polarization component, and the light reaches the exit surface 3 while being kept in the P-polarized state.

Thus, by setting the incidence angle A2 on the reflection surface 2 to satisfy a relation 41.8 deg.≦A2<90 deg., the light can be reflected with approximately 100% efficiency and can be directed to the light exit surface 3.

Finally, in order that the light which reaches the light exit surface 3 is emitted without a loss of light quantity, like the light entrance surface 1, it should satisfy a positional relation "the direction of polarization is placed in the P-polarization while a Brewster angle is satisfied". Namely;

$$\tan \psi_{b3} = ng/nc = 0.66666$$

should be satisfied. The angle $\psi_{b3}$ satisfying this relation is about 33.7 deg.

Therefore, when the emission angle $A3=\Psi_{b3}=33.7$ degrees is set, the reflection light of a P-polarized component can pass through the light exit surface 3 with approximately 100% efficiency.

As described above, when the light is parallel light and it is in the linearly polarized state, use of an internal reflection type optical element which is disposed so as to "satisfy that the light entrance surface and the light exit surface satisfy the Brewster angle while the reflection surface satisfies the total reflection" enables that the loss of light quantity at the refraction surface and reflection surface is reduced theoretically to zero. Thus, the loss of light quantity in an optical system using such an internal reflection type optical element can be decreased considerably.

Namely, when the angle defined between the light entrance surface 1 and the light exit surface 3 is θ, since $A1=A3'=\psi_{b1}$ and $A1'=A3=\psi_{b3}$, it follows that a relation below should be satisfied:

$$\theta+2\times A2=180 \text{ deg.}$$

where the critical angle $\leq A2<90$ deg.

Figure 3:
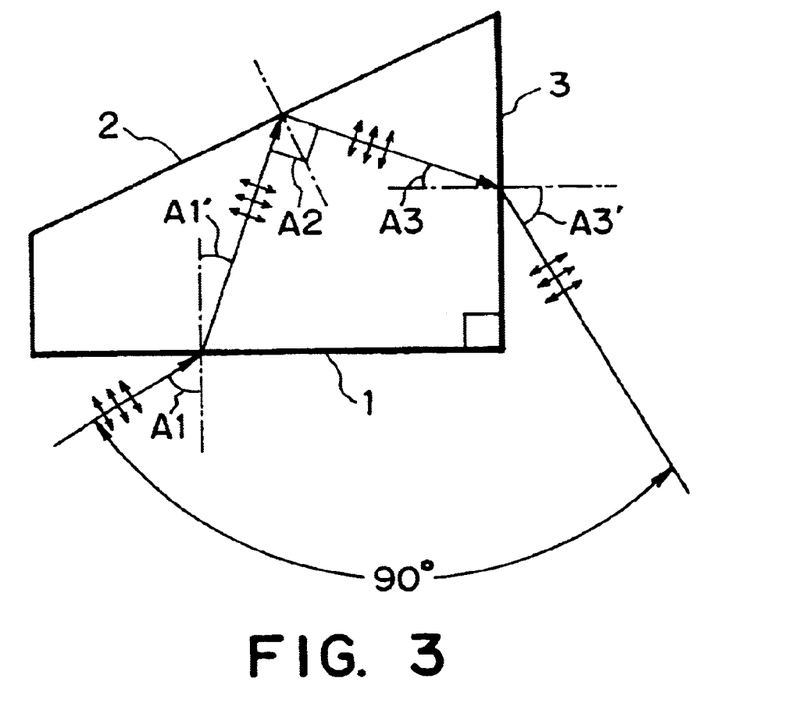
FIG. 3 is a schematic view of an internal reflection type optical element in a second embodiment of the present invention.

Further, θ=90 deg. such as shown in FIG. 3 may be preferable in the point of production and, on that occasion, the emitted light can be deflected by 90 deg. with respect to the incident light. The reflection surface on that occasion may be disposed to satisfy A2=45 deg.

Here, when the incident light is a light flux having a single-side opening angle of 3 deg., namely, the incidence angle A1 is 56.3±3 deg., the deflection efficiency at the interface (incidence, reflection, and emission) is such as shown in Table 1 below.

TABLE 1

| [nc/ng = 1.5] | | | |
|---|---|---|---|
| Incidence Angle A1(Deg) | Rp/Surface(%) | A2 (Deg) | Deflection Efficiency(%) |
| 53.3 | 0.09 | 46.4 | 99.82 |
| 54.3 | 0.04 | 45.9 | 99.92 |
| 55.3 | 0.01 | 45.5 | 99.98 |
| 56.3 | 0 | 45.0 | 100.00 |
| 57.3 | 0.01 | 44.6 | 99.98 |
| 58.3 | 0.05 | 44.1 | 99.90 |
| 59.3 | 0.11 | 43.7 | 99.78 |

From Table 1, it is seen that, when nc/ng=1.5, the reflection factor at the light entrance surface 1 to P-polarized light is about 0.1% if the single-side opening angle is 3 deg., it is 0.05% with an angle of 2 deg. and it is 0.01% with an angle of 1 deg. This applies also to the light exit surface. Further, the incidence angle A2 at the reflection surface 2 satisfies the condition for total reflection. Thus, as shown in Table 1, a deflection efficiency of about 99.8% is assured with an opening angle of 3 deg., and an efficiency of not less than 99.9% is assured with an opening angle of 2 deg. or less. However, for more exact deflection efficiency, the transmission factor corresponding to the thickness of the glass material should be taken into account.

As described above, even for a light flux being linearly polarized and having a single-side opening angle of about 3 deg. or less, use of the internal reflection type optical element in the embodiment of FIG. 2 accomplishes efficient light deflection.

Figure 4:
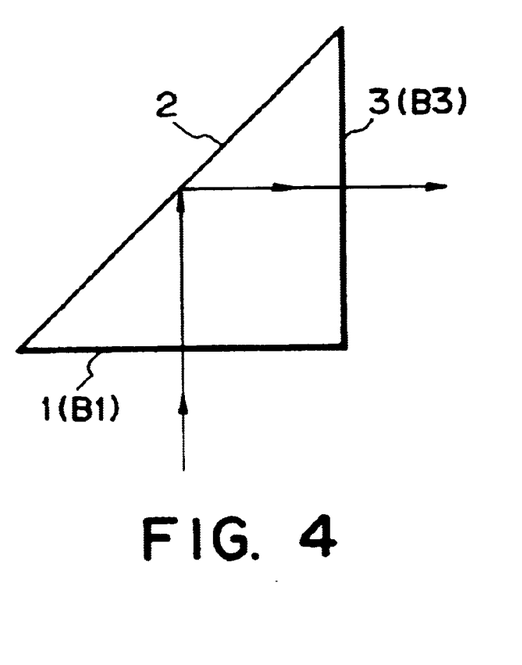
FIG. 4 is a schematic view for explaining a right-angle prism.

FIG. 4 shows a right-angle prism in which a reflection surface 2 thereof causes total reflection, to thereby perform the light deflection. This structure is preferable in the point of manufacture because it is very simple. However at a light entrance surface 1 and a light exit surface 3, an anti-reflection film B1 or B3 should preferably be provided. If such an anti-reflection film is provided, the incident light is not limited to linearly polarized light, but the light utilization efficiency of the prism depends on the efficiency of the anti-reflection film.

Next, an example wherein an ArF excimer laser having a wavelength of 193 nm is used as a light source of an exposure apparatus, will be described. Because of chromatic aberration of a projection optical system in the exposure apparatus, in this example, the ArF excimer laser light is band-narrowed and, as regards the polarization level, it is approximately linearly polarized with 95% or more. Also, it is a substantially parallel light having a single-side opening angle of 1 deg. or less.

Figure 5:
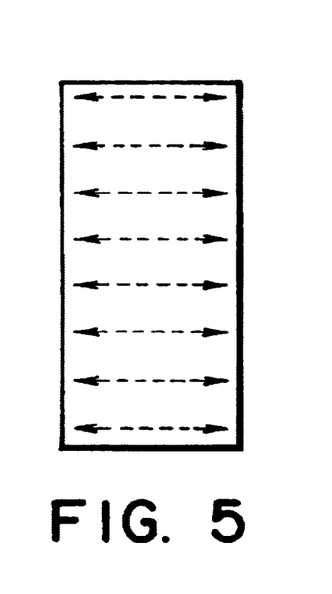
FIG. 5 is a schematic view for explaining polarization and a beam profile of an ArF excimer laser beam.

FIG. 5 illustrates the beam profile and the state of polarization.

The internal reflection type optical element shown in FIG. 3 is used, and the efficiency for deflection of this ArF excimer laser light is calculated. When a 95% linearly polarized component is incident on the light entrance surface 1 as a P-polarized component, the P-polarized component light can pass through the light entrance surface with an efficiency of 100%. However, as regards light of an S-polarized component which is very small, 14.8% is reflected. Since (95%×1)+(5%×0.852)=99.26%, the transmission factor is 99.26%.

A similar phenomenon appears also at the light exit surface and, therefore, the deflection efficiency of the internal reflection type optical element of FIG. 2 becomes very low, as 98.5%.

In consideration of it, an embodiment for further improving the deflection efficiency with the use of approximately linearly polarized light such as the ArF excimer laser light described above, will be explained.

Figure 6:
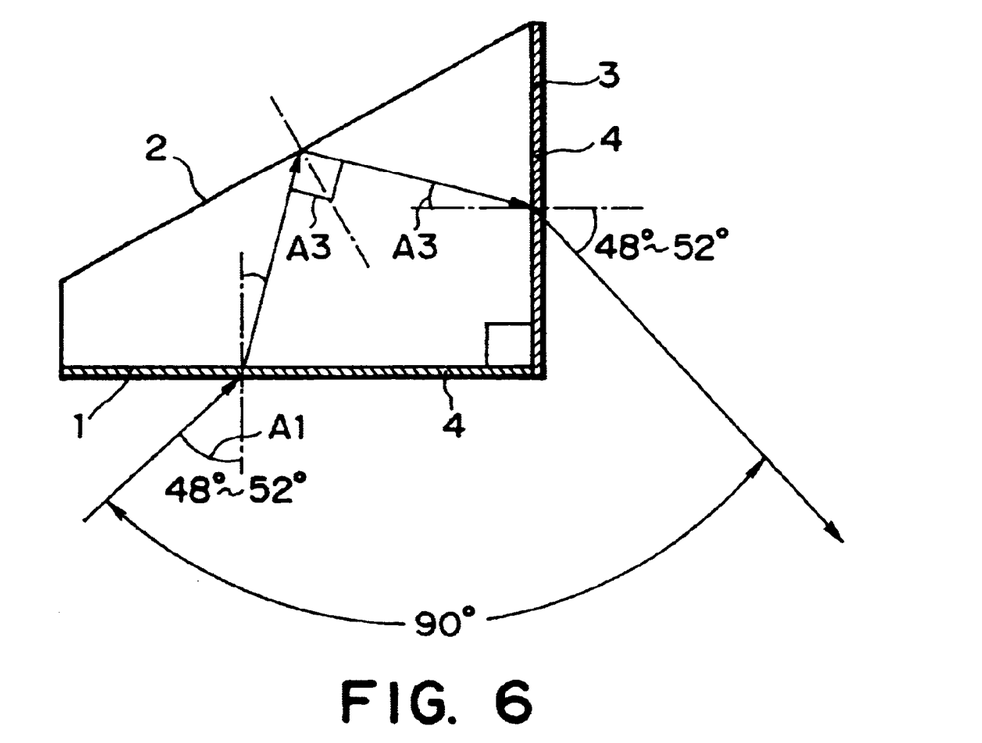
FIG. 6 is a schematic view of an internal reflection type optical element in a third embodiment of the present invention.

FIG. 6 is a schematic view of an internal reflection type optical element, being different from the example of FIG. 2. The internal reflection type optical element of FIG. 6 is made of fluorite glass ($CaF_2$) having a refractive index nc=1.5. The space surrounding it is filled with a medium (refractive index ng=1) having a sufficient transmissivity to a wavelength 193 nm. For enhancement of transmission efficiency, a light entrance surface 1 and a light exit surface 3 which are refraction surfaces are over-coated with a material having a refractive index n=1.4, for example, and the incidence angle A1 is set in accordance with the condition for the coating 4. This is for the following reason. That is, when a refraction surface such as a light incidence surface is over-coated, since the refraction angle at each interface of the coating layer is determined by a sine function, there occurs an error from the Brewster condition as determined by a tangent function and, as a result, the transmission factor is degraded. Namely, the incidence angle for providing an optimum transmission efficiency should be set in accordance with the thickness and the refractive index of the coating material.

Table 2 below shows the incidence angle A1 at the light entrance surface, the reflection factor (Rs, Rp) and the deflection efficiency at each interface (incidence, reflection, and emission), in an example wherein a fluorite material is over-coated by a substance having a refractive index n=1.4, with a thickness of 55 nm.

TABLE 2

[Substrate (n = 1.5), Coating (n = 1.4, thickness 55 nm)]
[Approx. Linear Polarization, P = 95%, S = 5%]

| Incidence Angle A1(Deg) | Rs/Surface(%) | Rp/surface(%) | Deflection Efficiency(%) |
|---|---|---|---|
| 48 | 5.54 | 0.08 | 99.65 |
| 49 | 5.83 | 0.05 | 99.66 |
| 50 | 6.14 | 0.02 | 99.67 |
| 51 | 6.47 | 0.01 | 99.67 |
| 52 | 5.83 | 0 | 99.66 |

From Table 2, it is seen that, with the provision of the over-coating, when the incidence angle A1=48 to 52 deg., a transmission efficiency of 99.65% is attainable per one refraction surface, and that the deflection efficiency of the internal reflection type optical element can be improved up to 99.3%.

As described above, when approximately linearly polarized light having a single-side opening angle of 2 deg. or less and having a polarization level of about 95% is used, a high deflection efficiency is attainable on the basis of the provision of an over-coating on a refraction surface and an optimum incidence angle.

When a glass material having a deliquescence, such as fluorite, is used, preferably, its surface may be over-coated also as providing a protection film thereto. The over-coating at the refraction surface may be substituted in accordance with the condition such as shown in Table 2. On the other hand, as regards the over-coating at the reflection surface, it should desirably be made by use of a material having a durability while satisfying the total reflection. More desirably, the over-coating material used in the refraction surface may be used therefor.

Figure 7:
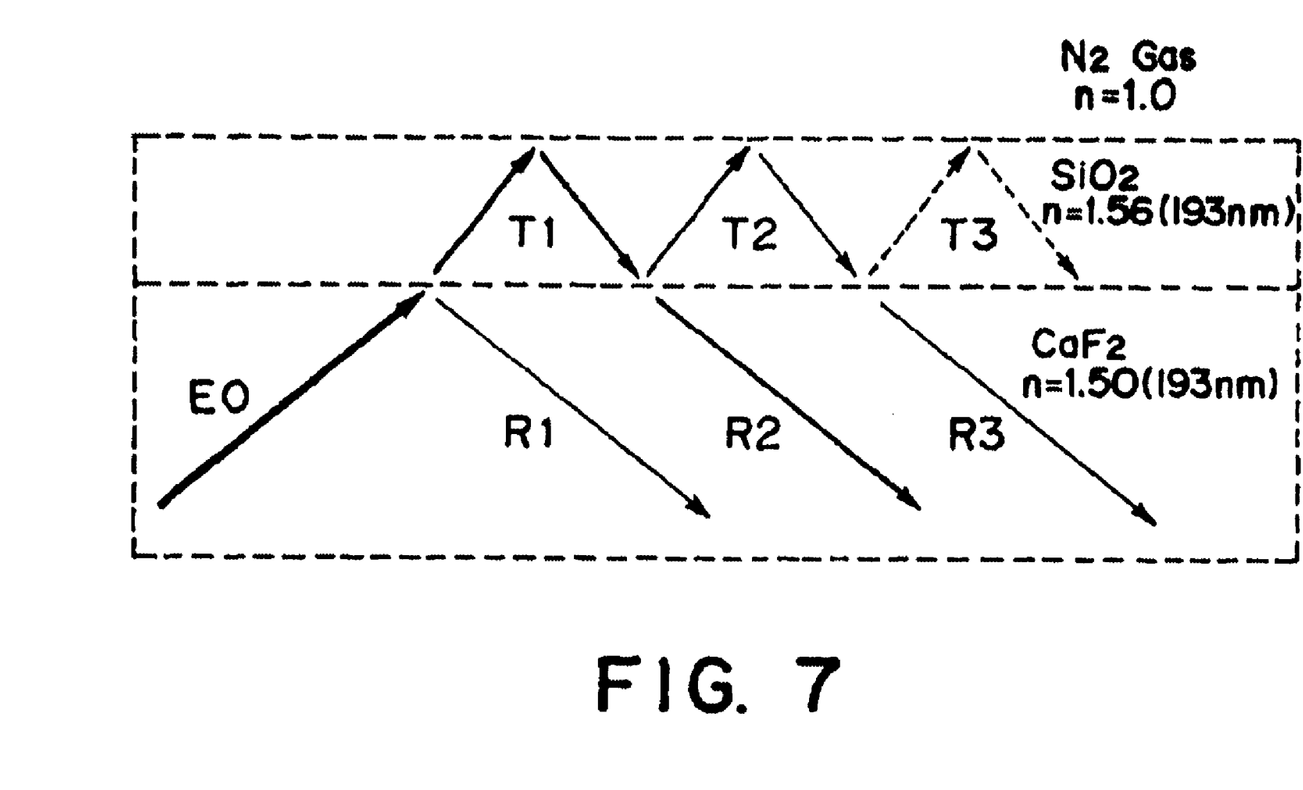
FIG. 7 is a schematic view for explaining a case wherein a reflection surface is over-coated.

FIG. 7 shows a case wherein $SiO_2$, for example, is used to over-coat the reflection surface 2 therewith. Reference character E0 denotes the incident light impinging on the reflection surface. At the interface between $CaF_2$ and $SiO_2$, most (T1) of the light E0 is transmitted into the $SiO_2$ coating layer, while a portion (R1) is reflected thereby. The transmitted light T1 is totally reflected by the interface between $SiO_2$ and the medium (e.g., nitrogen ambience). At the interface between $CaF_2$ and $SiO_2$, most (R2) of the light T1 is transmitted back to $CaF_2$. A portion (T2) thereof is reflected toward the $SiO_2$ coating layer and, after this, total reflection (at the interface between $SiO_2$ and nitrogen) and reflection/refraction (at the interface between $CaF_2$ and $SiO_2$) are repeated.

Thus, the incident light (E0) toward the total reflection surface and the light (R1+R2+R3+ . . . ) reflected back to $CaF_2$ are equal to each other and, as a result, deflection without a loss of light quantity is assured. Here, since the thickness of the $SiO_2$ coating layer is on an order of a few tens of nanometers, the loss of transmission factor at the $SiO_2$ coating layer is very small and it can be disregarded.

In the embodiments described hereinbefore, fluorite ($CaF_s$) is used as a glass material. However, composite quartz ($SiO_2$), $MgF_2$ or LiF, for example, may be used. Further, as regards the wavelength to be used, in place of an ArF excimer laser (wavelength 193 nm), an $F_2$ laser (wavelength 157 nm) or an $Ar_2$ laser (wavelength 126 nm), for example, may be used. As a matter of course, the present invention is applicable to the use of a wavelength of 200 nm or longer.

Next, an embodiment of a semiconductor device manufacturing process which uses an exposure apparatus shown in FIG. 1 will be explained.

Figure 8:
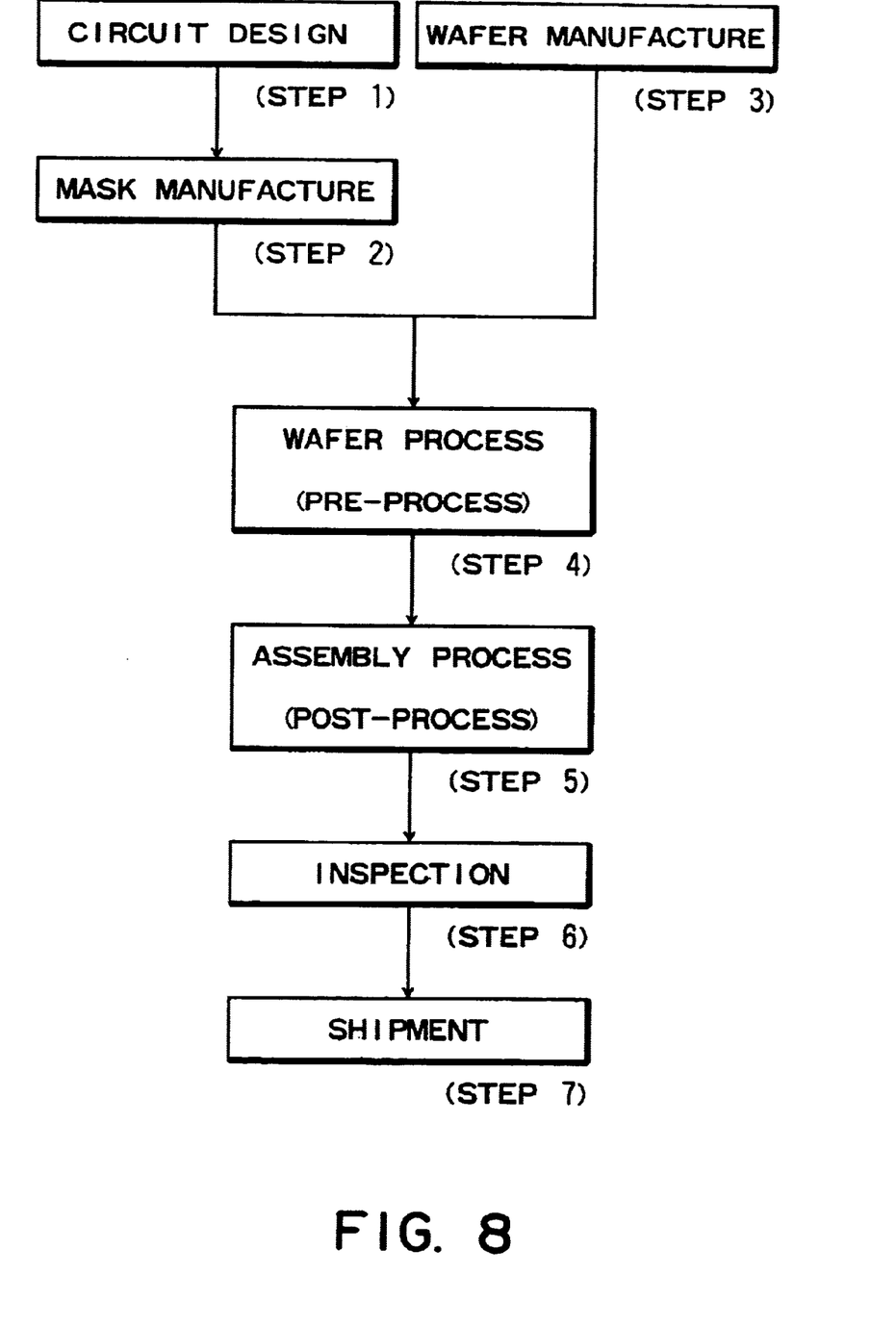
FIG. 8 is a flow chart of device manufacturing processes.

FIG. 8 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 9:
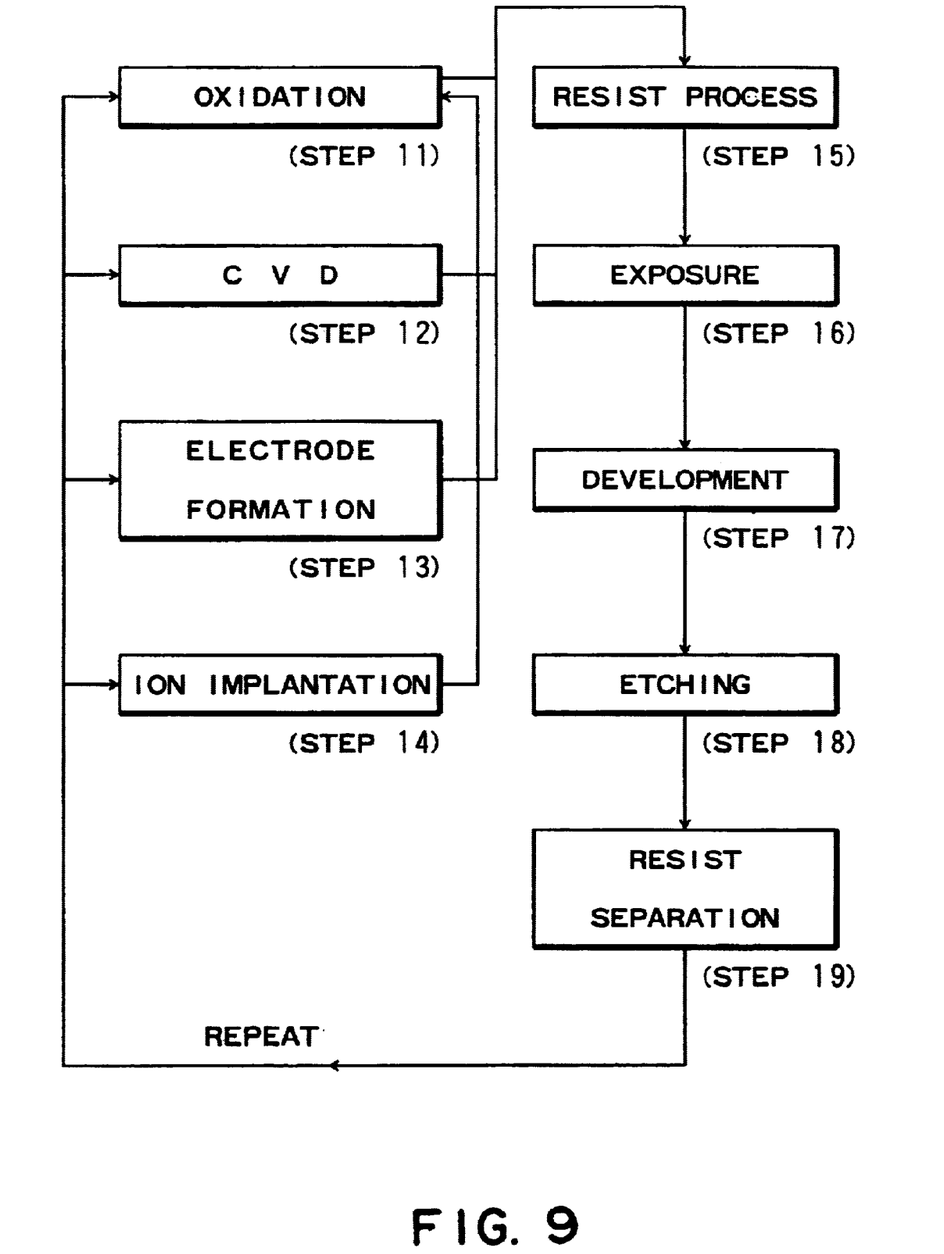
FIG. 9 is a flow chart for explaining details of a wafer process in the procedure shown in FIG. 8.

FIG. 9 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the present invention as described hereinbefore, an optical system is provided by which deflection of light is assured while a high reflection factor can be retained even with respect to light of a short wavelength, and also, linear polarization of the light can be dissolved.

While the invention has been described with reference to the structures disclosed herein, it is not confined to the details set forth and this application is intended to cover such modifications or changes as may come within the purposes of the improvements or the scope of the following claims.

What is claimed is:

1. An optical system, comprising:
   an internal reflection type optical member for changing a direction of advancement of an approximately linearly polarized light on the basis of total reflection; and
   a depolarizing member for dissolving linear polarization of light emitted from said optical member,
   wherein said optical member has a light entrance surface arranged so that a P-polarized component is incident thereon with a Brewster angle.

2. An optical system, comprising:
   an internal reflection type optical member for changing a direction of advancement of an approximately linearly polarized light on the basis of total reflection; and
   a depolarizing member for dissolving linear polarization of light emitted from said optical member, wherein said optical member has a light exit surface arranged so that a P-polarized component is emitted therefrom with a Brewster angle.

3. An optical system, comprising:

an internal reflection type optical member for changing a direction of advancement of an approximately linearly polarized light on the basis of total reflection; and a depolarizing member for dissolving linear polarization of light emitted from said optical member, wherein, when an angle defined between a light entrance surface and a light exit surface of said optical member is θ and an incidence angle of light incident on a reflection surface of said optical member is A2, said optical member satisfies a relation:

θ+2·A2=180 (deg).

4. An optical system according to claim 3, wherein the angle θ defined between the light entrance surface and the light exit surface of said optical member is 90 deg.

5. An optical system, comprising:

an internal reflection type optical member for changing a direction of advancement of an approximately linearly polarized light on the basis of total reflection; and a depolarizing member for dissolving linear polarization of light emitted from said optical member, wherein the approximately linearly polarized light to be deflected by said optical member has an opening angle at one side not greater than 3 deg.

6. An optical system, comprising:

an internal reflection type optical member for changing a direction of advancement of an approximately linearly polarized light on the basis of total reflection; and a depolarizing member for dissolving linear polarization of light emitted from said optical member, wherein said optical member has a light entrance surface and a light exit surface each having an anti-reflection film formed thereon.

7. An optical system, comprising:

an internal reflection type optical member for changing a direction of advancement of an approximately linearly polarized light on the basis of total reflection; and a depolarizing member for dissolving liner polarization of light emitted from said optical member, wherein said optical member has a light entrance surface and a light exit surface each being over-coated with a material having a refractive index lower than that of said optical member.

8. An optical system, comprising:

an internal reflection type optical member for changing a direction of advancement of an approximately linearly polarized light on the basis of total reflection;

a depolarizing member for dissolving linear polarization of light emitted from said optical member; and a mirror having a dielectric film, wherein, for deflection of the approximately linearly polarized light, when the light is P-polarized light with respect to a light entrance surface of said mirror having the dielectric film or said optical member, said optical member is used for the deflection, and wherein, when the light is S-polarized light, said mirror is used for the deflection.

9. An illumination optical, comprising:

an internal reflection type optical member for changing a direction of advancement of an approximately linearly polarized light on the basis of total reflection;

a depolarizing member for dissolving linear polarization of light emitted from said optical member;

a fly's eye lens for receiving light having its linear polarization dissolved by said depolarizing member and for producing a plurality of secondary light sources at a light exit surface thereof; and a lens system for superposing light beams from the secondary light sources one upon another on a surface to be illuminated.

10. An optical system, comprising:

an internal reflection type optical member for changing a direction of advancement of an approximately linearly polarized light on the basis of total reflection; and a depolarizing member for dissolving linear polarization of light emitted from said optical member, wherein said optical member has a light entrance surface arranged so that a P-polarized component is incident thereon with a Brewster angle.

11. An optical system, comprising:

an internal reflection type optical member for changing a direction of advancement of an approximately linearly polarized light on the basis of total reflection; and a depolarizing member for dissolving linear polarization of light emitted from said optical member, wherein said optical member has a light exit surface arranged so that a P-polarized component is emitted therefrom with a Brewster angle.

12. An optical system, comprising:

an internal reflection type optical member for changing a direction of advancement of an approximately linearly polarized light on the basis of total reflection; and a depolarizing member for dissolving linear polarization of light emitted from said optical member, wherein, when an angle defined between a light entrance surface and a light exit surface of said optical member is θ and an incidence angle of light incident on a reflection surface of said optical member is A2 said optical member satisfies a relation:

θ+2·A2=180 (deg).

13. An optical system according to claim 12, wherein the angle θ defined between the light entrance surface and the light exit surface of said optical member is 90 deg.

14. An optical system, comprising:

an internal reflection type optical member for changing a direction of advancement of an approximately linearly polarized light on the basis of total reflection; and a depolarizing member for dissolving linear polarization of light emitted from said optical member, wherein the approximately linearly polarized light to be deflected by said optical member has an opening angle at one side, not greater than 3 degrees.

15. An optical system, comprising:

an internal reflection type optical member for changing a direction of advancement of an approximately linearly polarized light on the basis of total reflection; and a depolarizing member for dissolving linear polarization of light emitted from said optical member, wherein said optical member has a light entrance surface and a light exit surface each having an anti-reflection film formed thereon.

16. An optical system, comprising:

an internal reflection type optical member for changing a direction of advancement of an approximately linearly polarized light on the basis of total reflection; and a depolarizing member for dissolving linear polarization of light emitted from said optical member, wherein said optical member has a light entrance surface and a light exit surface each being over-coated with a material having a refractive index lower than that of said optical member.

17. An optical system, comprising:

an internal reflection type optical member for changing a direction of advancement of an approximately linearly polarized light on the basis of total reflection;

a depolarizing member for dissolving linear polarization of light emitted from said optical member; and a mirror having a dielectric film, wherein, for deflection of the approximately linearly polarized light, when the light is P-polarized light with respect to a light entrance surface of said mirror having the dielectric film or said optical member, said optical member is used for the deflection, and wherein, when the light is S-polarized light, said mirror is used for the deflection.

18. An exposure apparatus, comprising:

an illumination optical system including (i) an internal reflection type optical member for changing a direction of advancement of an approximately linearly polarized light on the basis of total reflection, and (ii) a depolarizing member for dissolving linear polarization of light emitted from said optical member; and a projection optical system for projecting a pattern, formed on a surface to be illuminated by said illumination optical system, onto a substrate.

19. A device manufacturing method, comprising the steps of:

illuminating a surface to be illuminated with an illumination optical system that includes (i) an internal reflection type optical member for changing a direction of advancement of an approximately linearly polarized light on the basis of total reflection, and (ii) a depolarizing member of dissolving linear polarization of light emitted from the optical member; and transferring a pattern, formed on the surface to be illuminated, onto a substrate by use of a projection optical system.

* * * * *

UNITED STATES PATENT AND TRADEMARK OFFICE
CERTIFICATE OF CORRECTION

PATENT NO.     : 6,674,514 B2
DATED          : January 6, 2004
INVENTOR(S)    : Ken-ichiro Shinoda It is certified that error appears in the above-identified patent and that said Letters Patent is hereby corrected as shown below:

Column 3,
Line 20, "while" should read -- whole --.

Column 11,
Line 64, "optical," should read -- optical system, --.

Column 12,
Lines 10, 19, 29, 42, 45, 54 and 64, "An" should read -- An illumination --.
Line 38, "A2" should read -- A2, --.

Column 13,
Line 7, "An" should read -- An illumination --.

Signed and Sealed this

Twenty-ninth Day of June, 2004

JON W. DUDAS
*Acting Director of the United States Patent and Trademark Office*